US010385156B2

United States Patent
Zhou et al.

(10) Patent No.: US 10,385,156 B2
(45) Date of Patent: Aug. 20, 2019

(54) PERFORMANCE HIGH VINYL BLOCK COPOLYMER COMPOSITIONS AND USES THEREOF

(71) Applicant: KRATON POLYMERS U.S. LLC, Houston, TX (US)

(72) Inventors: Yonghua Zhou, Houston, TX (US); Ruidong Ding, Houston, TX (US); Liqiang Ma, Shanghai (CN)

(73) Assignee: Kraton Polymers U.S. LLC, Houston, TX (US)

( * ) Notice: Subject to any disclaimer, the term of this patent is extended or adjusted under 35 U.S.C. 154(b) by 121 days.

(21) Appl. No.: 15/638,110

(22) Filed: Jun. 29, 2017

(65) Prior Publication Data

US 2018/0002474 A1   Jan. 4, 2018

Related U.S. Application Data

(60) Provisional application No. 62/356,985, filed on Jun. 30, 2016.

(51) Int. Cl.
| | |
|---|---|
| *C08F 297/04* | (2006.01) |
| *C08F 297/08* | (2006.01) |
| *C08J 5/18* | (2006.01) |
| *C08L 23/12* | (2006.01) |
| *C08L 53/00* | (2006.01) |

(Continued)

(52) U.S. Cl.
CPC ...... *C08F 297/044* (2013.01); *C08F 297/083* (2013.01); *C08J 5/18* (2013.01); *C08L 23/12* (2013.01); *C08L 53/00* (2013.01); *C08J 2353/02* (2013.01); *G01N 2030/486* (2013.01); *G01R 33/46* (2013.01)

(58) Field of Classification Search
CPC ....... C08L 23/12; C08L 53/00; C08F 297/044
See application file for complete search history.

(56) References Cited

U.S. PATENT DOCUMENTS

| | | |
|---|---|---|
| 3,594,452 A | 7/1971 | De La Mare et al. |
| 3,595,942 A | 7/1971 | Wald et al. |
| (Continued) | | |

FOREIGN PATENT DOCUMENTS

| | | |
|---|---|---|
| EP | 2407512 A1 | 6/2014 |
| WO | 2014002984 A1 | 1/2014 |

OTHER PUBLICATIONS

"Kraton D4150 Data Document", Kraton Polymers, Jul. 24, 2007 (Jul. 24, 2007), [available online at http://docs.kraton.com/pdfDocuments/20080205075559718153014.PDF; accessed Aug. 31, 2017 (Aug. 31, 2017).

*Primary Examiner* — Mark S Kaucher
(74) *Attorney, Agent, or Firm* — Ramesh Krishnamurti (57) ABSTRACT

Provided herein are improved performance high vinyl block copolymer compositions. The compositions may include a block copolymer and a polyolefin. The block copolymer may have a microstructure characterized by a vinyl content of equal to or greater than about 60%. The block copolymer may be a styrenic block copolymer. The polyolefin may include a polypropylene. Additional additives may be optionally added to the composition depending on the end-use application. The compositions may find utility in the preparation of various articles such as medical products including sterilized tubing, bags, and the like, films and injection molded articles.

18 Claims, 2 Drawing Sheets

(51) Int. Cl.
*G01N 30/00* (2006.01)
*G01R 33/46* (2006.01)

(56) References Cited

U.S. PATENT DOCUMENTS

| | | | |
|---|---|---|---|
| 3,634,549 A | 1/1972 | Shaw et al. | |
| 3,670,054 A | 6/1972 | De La Mare et al. | |
| 3,692,874 A | 9/1972 | Farrar et al. | |
| 3,700,633 A | 10/1972 | Wald et al. | |
| 3,880,954 A | 4/1975 | Kahle et al. | |
| 3,985,830 A | 10/1976 | Fetters et al. | |
| 4,076,915 A | 2/1978 | Trepka | |
| 4,104,332 A | 8/1978 | Zelinski | |
| 4,185,042 A | 1/1980 | Verkouw | |
| 4,379,891 A | 4/1983 | Haynes | |
| 4,386,188 A | 5/1983 | Grancio et al. | |
| 5,075,377 A | 12/1991 | Kawabuchi et al. | |
| 5,272,214 A | 12/1993 | Custro et al. | |
| 5,320,899 A * | 6/1994 | Djiauw | C08J 5/18 428/220 |
| 5,681,895 A | 10/1997 | Tackett | |
| 6,040,382 A | 3/2000 | Hanes | |
| 6,730,745 B2 | 5/2004 | Bening et al. | |
| 6,846,535 B2 | 1/2005 | de Groot et al. | |
| 7,009,000 B2 | 3/2006 | Bening et al. | |
| 7,186,779 B2 | 3/2007 | Joly et al. | |
| 7,220,798 B2 | 5/2007 | Atwood et al. | |
| 7,439,301 B2 | 10/2008 | Handlin, Jr. | |
| 8,188,172 B2 | 5/2012 | Handlin, Jr. et al. | |
| 8,188,192 B2 * | 5/2012 | Handlin, Jr. | A61L 15/24 525/241 |
| 9,243,163 B2 | 1/2016 | Salazar | |
| 9,249,335 B2 | 4/2016 | Wiegand et al. | |
| 9,321,932 B2 | 4/2016 | De Jong | |
| 2002/0099107 A1* | 7/2002 | Tucker | D01F 6/46 521/71 |
| 2011/0262686 A1* | 10/2011 | Wright | C08L 53/025 428/114 |
| 2016/0032096 A1* | 2/2016 | Handlin, Jr. | C08L 23/04 525/98 |

* cited by examiner

PERFORMANCE HIGH VINYL BLOCK COPOLYMER COMPOSITIONS AND USES THEREOF

CROSS-REFERENCE TO RELATED APPLICATIONS

This application claims the benefit of U.S. Provisional Application No. 62/356,985, filed Jun. 30, 2016, incorporated herein by reference in its entirety.

TECHNICAL FIELD

The present disclosure relates to the field of chemistry. More specifically, the present disclosure relates to compositions and methods for the preparation of high vinyl block copolymers and performance characteristics thereof.

BACKGROUND

Plasticized polyvinyl chloride (PVC) is widely used in medical applications such as IV-bags, blood bags, connectors, and tubing. Drawbacks to the use of plasticized PVC include the undesired environmental impact related to the release of dioxins when PVC is incinerated in an uncontrolled manner. Additionally, migration of plasticizers, so-called "oestrogen mimics", from plasticized PVC into the human body may have a negative health effect. These two major disadvantages are the driving force behind the development of PVC alternatives.

WO 2014/002984 A1 discloses hydrogenated block copolymer pellets which are free from blocking with each other and formed into a molded body that has excellent transparency, flexibility, bleed-out properties and low combustion ash content. The hydrogenated block copolymer pellets contain 100 parts by mass of a pellet molded body that is formed of a hydrogenated block copolymer (A) and 0.01-1.5 parts by mass of flour that is formed of a polyethylene powder (B). The hydrogenated block copolymer (A) has at least one polymer block (a) that is mainly composed of a vinyl aromatic monomer unit and at least one polymer block (b) that is mainly composed of a conjugated diene monomer unit and has a total of the 1,2-bond content and the 3,4-bond content of 40-90% before hydrogenation. The hydrogenated block copolymer (A) has a hardness of 30-67; the content of the polymer block (a) in the hydrogenated block copolymer (A) is 5-30% by mass; and the polyethylene powder (B) has a number average molecular weight of 15,000 or less, an average particle diameter of 1-15 μm and a repose angle of 45-70°.

EP 2407512 A1 discloses a tube which has good transparency, flexibility, and solvent adhesion, and also has excellent clamp resistance, anti-conglutination property, and kink resistance, and a medical device using the tube. Specifically provided are a tube produced by forming a resin composition into a tube shape, which contains a styrene-based thermoplastic elastomer (a) and a polypropylene-based resin (b) and does not contain a softening agent, in which: the elastomer (a) is a product prepared by hydrogenating a block copolymer including at least a polymer block (A) formed of an aromatic vinyl compound and a polymer block (B) formed of isoprene and/or 1,3-butadiene; the content of the polymer block (A) is 5 to 40 mass % before hydrogenation, the polymer block (B) has a hydrogenation ratio of 70% or more, and the polymer block (B) includes a 1,2-bond and a 3,4-bond at a content of 30 to 85 mol percent; the mass ratio of the styrene-based thermoplastic elastomer (a) to the polypropylene-based resin (b) [(a)/(b)] is 90/10 to 40/60; and the tube has a ratio of a diffraction peak intensity [I(14)] at a scattering angle of 14° to a diffraction peak intensity [I(15)] at a scattering angle of 15° [I(14)/I(15)] of 1.4 or more in X-ray diffraction, and a medical device including the tube.

U.S. Pat. No. 6,846,535 discloses a kink resistant medical tube manufactured from a polymer composition comprising: a) a random polypropylene copolymer; and b) a block copolymer comprising at least two vinyl aromatic polymer blocks and at least one hydrogenated conjugated diene polymer block, wherein the hydrogenated conjugated diene polymer block has a vinyl content before hydrogenation of at least 50%.

U.S. Pat. No. 7,439,301 discloses an elastomeric hydrogenated block copolymer capable of being directly extruded or molded with a minimum of additives and having both high elasticity and low permanent set. The hydrogenated block copolymers have high melt flows allowing for ease in processing the hydrogenation block copolymers in melt processes such as extrusion and molding.

Thus, there exists a need for alternatives to PVC based compositions.

SUMMARY

Provided herein are improved performance high vinyl block copolymer compositions including i) a styrenic block copolymer present in an amount of from about 5 wt. % to about 95 wt. % based on the total weight of the composition and ii) a polyolefin present in an amount of from about 2 wt. % to about 98 wt. % based on the total weight of the composition. The composition may have an Isotropic Ratio of less than about 1.4 as measured on extruded film with process temperature of less than about 250° C.

Also disclosed herein are end-use articles including films, tubes, hot-melt adhesives, and injection molded articles made of the improved performance high vinyl block copolymer compositions.

DETAILED DESCRIPTION

The molecular weight referred to in the present disclosure and claims can be measured using any suitable methodology such as gel permeation chromatography (GPC). For example, the molecular weight may be determined using GPC that employs polystyrene calibration standards as in accordance with ASTM 3536. The molecular weights expressed herein are measured at the peak of the GPC trace and are commonly referred to as "peak molecular weights."

"Coupling efficiency" as disclosed herein may be measured by GPC and is defined as the number of molecules of coupled polymers divided by the number of molecules of coupled polymer plus the number of molecules of uncoupled polymer.

"1,2-addition diene in B block" as disclosed herein is measured by any suitable methodology such as Fourier Transform Infrared (FTIR) spectroscopy or proton nuclear magnetic resonance (NMR) spectroscopy and may be calculated by determining the percentage of 1,2-addition diene in the butadiene block (i.e., B Block) prior to hydrogenation.

The polystyrene content (PSC) in block copolymers of the present disclosure may be determined using any suitable methodology such as proton NMR.

Additional terms of art used throughout this disclosure include the order-disorder transition temperature (ODT) which refers to the temperature at which the microdomain structure of the block copolymer is completely lost. The ODT can also be referred to as the microphase separation transition (MST). Herein "SEBS" refers to a polystyrene-poly(ethylene/butylene)-polystyrene triblock copolymer while "HSBC" refers to a selectively hydrogenated styrenic block copolymer. Elasticity refers to the ability of an elastomer to resume its normal shape after being stretched or compressed. Hysteresis refers to a permanent strain after an elastomer is stretched to a certain strain and then the stress is relieved, and percentage of recovery is calculated during the process.

Disclosed herein are compositions comprising i) a block copolymer and ii) a polyolefin. In an aspect, the block copolymer has a microstructure characterized by a vinyl content of equal to or greater than about 60%. In the aspects disclosed herein the block copolymer is a styrenic block copolymer. In some aspects, the polyolefin comprises polypropylene. The compositions disclosed herein may find utility in the preparation of medical products such as sterilized tubing, bags, and the like.

In an aspect, a block copolymer of the present disclosure contains a polymer block of a monoalkenyl arene, denoted as A block, and a polymer block of one or more conjugated dienes, denoted as B block. The block copolymers of the present disclosure can be linear block copolymers, linear coupled block copolymers, or radial block copolymers. Preparation of radial (branched) block copolymers includes a post-polymerization step called "coupling" and herein "X" denotes the remnant or residue of a coupling agent used in the preparation of the radial block copolymer.

In an aspect, linear block copolymers can be made by polymerizing a monoalkenyl arene to form a first A block, adding one or more conjugated dienes to form a B block, and then adding additional monoalkenyl arene to form a second A block. A linear coupled block copolymer can be made by forming the first A block and B block and then contacting the diblock with a multifunctional coupling agent that results in the chemical addition of another block or blocks.

Nonlimiting configurations of a block copolymer suitable for use in the present disclosure include $(AB)_nX$, $A_1BA_2$, $(A_1BA_2)_nX$, $(A-B)_n$, and $(A_1-B-A_2)_n$. In an aspect, $A_1$ and/or $A_2$ are polymer blocks comprising monoalkenyl arenes selected from the group consisting of styrene, alpha-methyl styrene, para-methylstyrene, vinyl toluene, vinylnaphthalene, diphenyl ethylene, para-butyl styrene and mixtures thereof; alternatively the monoalkenyl arene is styrene. In an aspect, $A_1$ and $A_2$ are the same while in another aspect $A_1$ and $A_2$ are different.

In an aspect, the block copolymer has the configuration $(AB)_nX$ where n is greater than or equal to about 2; or alternatively n is from 2 to 6. In such aspects, X is a coupling agent residue. Examples of such coupling agents include among others silica compounds, including silicon tetrachloride and alkoxy silanes as described in U.S. Pat. Nos. 3,244,664; 3,692,874; 4,076,915; 5,075,377; 5,272,214; and 5,681,895; polyepoxides, polyisocyanates, polyimines, polyaldehydes, polyketones, polyanhydrides, polyesters, polyhalides as described in U.S. Pat. No. 3,281,383; diesters as described in U.S. Pat. No. 3,594,452; methoxy silanes as described in U.S. Pat. No. 3,880,954; divinyl benzene as described in U.S. Pat. No. 3,985,830; 1,3,5-benzenetricarboxylic acid trichloride as described in U.S. Pat. No. 4,104,332; glycidoxytrimethoxy silanes as described in U.S. Pat. No. 4,185,042; and oxydipropylbis(trimethoxy silane) as described in U.S. Pat. No. 4,379,891. A block copolymer having the $(AB)_nX$ configuration may be further characterized by the presence of some amount of the diblock copolymer (i.e., n=1) in the composition. For example, the amount of diblock copolymer may range from about 1 wt. % to about 70 wt. % based on the total weight of the block copolymer. In an aspect, the block copolymer has the configuration $A_1BA_2$ where the molecular weight of $A_1$ is the same as the molecular weight of $A_2$; alternatively the molecular weight of $A_1$ differs from the molecular weight of $A_2$.

In an aspect, the block copolymer has the configuration $(A_1BA_2)_nX$ where n is equal to or greater than about 2; or alternatively n ranges from about 2 to about 6 and X is an alkoxysilane coupling agent residue. The molecular weight of $A_1$ can be the same as the molecular weight of $A_2$; alternatively the molecular weight of $A_1$ differs from the molecular weight of $A_2$. A block copolymer having the $(A_1BA_2)_nX$ configuration may be further characterized by the presence of some amount of the triblock copolymer $A_1BA_2$ (i.e., n=1) in the composition. For example, the amount of triblock copolymer may range from about 1 wt. % to about 70 wt. % based on the total weight of the block copolymer.

In an aspect, the block copolymer has the configuration $(AB)_n$ where n is equal to or greater than about 2.

In an aspect, the block copolymer has the configuration $(A_1-B-A_2)_n$ where n is equal to or greater than about 2; or alternatively n ranges from about 2 to about 6. The molecular weight of $A_1$ can be the same as the molecular weight of $A_2$; alternatively the molecular weight of $A_1$ differs from the molecular weight of $A_2$. A block copolymer having the $(A_1-B-A_2)_n$ configuration may be further characterized by the presence of some amount of the triblock copolymer $A_1BA_2$ (i.e., n=1) in the composition. For example, the amount of triblock copolymer may range from about 1 wt. % to about 70 wt. % based on the total weight of the block copolymer.

Regardless of configuration, polymerization conditions to prepare the block copolymer of the type disclosed herein are similar to those used for anionic polymerizations. For example, the polymerization may be carried out at a temperature of from about −30° C. to about 150° C. in an inert atmosphere such as nitrogen, under a pressure within the range of from about 0.5 to about 10 bars. Suitable reaction conditions also include one or more polymerization initiators, for example, alkyl lithium compounds such as s-butyllithium, n-butyllithim, t-butyllithium, amyllithium and the like, and di-initiators such as the di-s-butyl lithium adduct of m-diisopropenyl benzene. Additional disclosure on the preparation of a styrenic block copolymer can be found in U.S. Pat. Nos. 7,220,798 and 7,439,301, the relevant portions of which are incorporated herein by reference.

Block copolymers suitable for use in the present disclosure may be hydrogenated or selectively hydrogenated. Hydrogenation can be carried out via any suitable hydrogenation or selective hydrogenation process. For example, methods to hydrogenate polymers containing aromatic or ethylenic unsaturation based upon operation of a suitable catalyst may be employed. Such catalyst, or catalyst precursor, may comprise a Group VIII metal such as nickel or cobalt which is combined with a suitable reducing agent such as an aluminum alkyl or hydride of a metal selected from Groups I-A, II-A, and III-B of the Periodic Table. Hydrogenation processes are disclosed, for example, in U.S. Pat. Nos. 3,595,942; 3,634,549; 3,670,054; and 3,700,633; the relevant portions of which are incorporated herein by reference.

In an aspect, the styrene content of the block copolymer ranges from about 8% to about 35% based on the weight percentage of polystyrene in the block copolymer; alternatively from about 10% to about 15%. Any styrene content within these ranges can be used with the presently disclosed subject matter. The molecular weight of each of the A blocks in the block copolymers of the present disclosure (i.e., $A_1$ and $A_2$) may be from about 3,000 g/mole to about 10,000 g/mol; or alternatively from about 4,000 g/mol to about 7,000 g/mol. Examples of other A block characteristics are described, for example, in U.S. Pat. Nos. 9,321,932; 9,249,335; 9,243,163; 7,186,779; 7,439,301; 7,009,000; and 6,730,745; the relevant portions of which are incorporated by reference herein.

In an aspect, the B block is composed mainly of polymerized conjugated diene. The B block may contain a mixture of conjugated dienes that are copolymerized. In addition, the B block may contain a copolymerizable monomer other than a conjugated diene that is copolymerized, in an amount of less than 5% by weight based on the weight of the B block. The B block may for instance comprise up to 5 wt. % of an aromatic monomer such as styrene. In an aspect, the conjugated diene used for the preparation of B block is butadiene. For example, each block of polymerized conjugated diene (i.e., B block) is a polybutadiene block containing less than 5 wt. % of another non-butadiene copolymerizable monomer (e.g., styrene), based on the total weight of the B block. In an aspect, the molecular weight of the B block may range from about 65 kg/mol to about 92 kg/mol, alternatively from about 80 kg/mol to about 92 kg/mol, or alternatively from about 85 kg/mol to about 90 kg/mol.

In some aspects of the present disclosure, the block copolymers are prepared so that they have from about 60 mol percent to about 85 mol percent vinyl in the B block prior to hydrogenation. The term "vinyl" is used herein to describe the polymer product that is made when 1,3-butadiene is polymerized via a 1,2-addition mechanism. The result is a monosubstituted olefin group pendant to the polymer backbone, a vinyl group. Vinyl configuration can be achieved by the use of a control agent during polymerization of the diene and by polymerization temperature. Any microstructure control agent known to those of ordinary skill in the art capable of preparing high vinyl conjugated dienes can be used to prepare the block copolymers of the present invention. Most preferred are microstructure control agents which are compatible with hydrogenation catalysts as described in U.S. Pat. No. 7,439,301 incorporated herein by reference. In another aspect, the block copolymers are prepared so that they have from about 65 mol percent to about 85 mol percent vinyl content in the B block prior to hydrogenation. In still another aspect, the block copolymers are prepared so that they have from about 70 mol percent to about 85 mol percent vinyl content in the B block prior to hydrogenation. Another aspect of the present disclosure includes block copolymers prepared so that they have from about 73 mol percent to about 83 mol percent vinyl content in the B block prior to hydrogenation.

In an aspect, the coupling efficiency of the block copolymer ranges from about 70% to about 98%.

In an aspect, the molecular weight of the block copolymer having the configuration $(A_1BA_2)_nX$ or the configuration $(AB)_nX$ where n is equal to 3, prior to hydrogenation, ranges from about 170 kg/mol to about 230 kg/mol.

In an aspect, a block copolymer suitable for use in the present disclosure may be further characterized by a tensile strength of from about 4.0 MPa to about 16 MPa. Tensile strength is defined herein as the maximum longitudinal stress a material can withstand before tearing and may be determined in accordance with ASTM D412.

In an aspect, a block copolymer and resulting compositions suitable for use in the present disclosure may be further characterized by an Isotropic Ratio (IR) less than about 1.4. The term "Isotropic Ratio" refers to the ratio of tensile strength measured in the cross direction to the tensile strength measured in the machine direction. The IR can be affected by processing temperature. In an aspect, a block copolymer and resulting compositions suitable for use in the present disclosure exhibit an IR of less than about 1.4 at a processing temperature of less than about 250° C. Herein the "processing temperature" refers to the melt temperature of the molten polymer during any processing or forming step.

In an aspect, a block copolymer suitable for use in the present disclosure is characterized by a 100% modulus at elongation ranging from about 0.4 MPa to about 1.6 MPa as determined in accordance with ASTM D412. The percentage modulus at elongation refers to the amount of stress necessary to stretch the material (i.e., block copolymer) to an elongation of that percentage (e.g., 100%). In another aspect, a block copolymer suitable for use in the present disclosure is characterized by a 200% modulus at elongation ranging from about 0.6 MPa to about 2.4 MPa. In yet another aspect, a block copolymer suitable for use in the present disclosure is characterized by a 300% modulus at elongation ranging from about 0.8 MPa to about 3.2 MPa.

In an aspect, a block copolymer suitable for use in the present disclosure is characterized by a high melt flow rate (MFR). The term "melt flow rate" is a measure of the melt flow of the polymer and may be determined in accordance with ASTM D1238 at 230° C. and 2.16 kg weight. It is expressed in units of grams of polymer passing through a melt rheometer orifice in 10 minutes. Block copolymers suitable for use herein may have a MFR of from about 3.0 g/10 min. to about 25 g/10 min.

In an aspect, a block copolymer suitable for use in the present disclosure is characterized by an elongation at break ranging from about 500% to about 1600% as determined in accordance with ASTM D412. Elongation at break, also known as fracture strain, refers to the ratio between changed length and initial length after breakage of the test specimen. It expresses the capability of a material to resist changes of shape without crack formation.

In an aspect, a block copolymer suitable for use in the present disclosure is characterized by an order-disorder transition temperature (ODT) of from about 180° C. to about 260° C. as determined by measurement of the complex viscosity and described further herein.

In an aspect, a composition of the present disclosure comprises (i) a block copolymer of the type disclosed herein; (ii) a polyolefin; and optionally (iii) one or more additives. A polyolefin suitable for use in the present disclosure is polypropylene.

The polypropylene may be a homopolymer or a copolymer or a combination thereof, provided, however, that the homopolymer may contain up to 5% of another alpha-olefin including, but not limited to, $C_2$-$C_8$ alpha-olefins such as ethylene and 1-butene. For example, the polypropylene homopolymer may be atactic polypropylene, isotactic polypropylene, hemi-isotactic, syndiotactic polypropylene, or combinations thereof. A polymer is "atactic" when its pendant groups are arranged in a random fashion on both sides of the chain of the polymer. In contrast, a polymer is "isotactic" when all of its pendant groups are arranged on the same side of the chain and "syndiotactic" when its pendant groups alternate on opposite sides of the chain. In hemi-isotactic polymer, every other repeat unit has a random substituent.

In some aspects, the polyolefin is a random copolymerized polypropylene. Polypropylene random copolymers are thermoplastic resins produced through the polymerization of propylene with alpha-olefins including ethylene or butene bonds introduced in the polymer chain. In other aspects, the polyolefin is a functionalized polypropylene such as, for example, the type produced by peroxide grafting of the polypropylene backbone. In yet other aspects, the polyolefin is a polypropylene-based elastomer, or combinations thereof. For example, the propylene-based elastomer can be a copolymer of propylene-derived units and units derived from at least one other $C_4$-$C_{10}$ alpha-olefin. Nonlimiting examples of polyolefins suitable for use in the present disclosure include Vistamaxx™ polymers, commercially available from ExxonMobil, Vistalon™ polymers from ExxonMobil, Versify™ polymers from Dow Chemical, and M-class rubber which is an ethylene propylene diene monomer rubber.

In some aspects, the polyolefin is an olefin block copolymer such as INFUSE™ from Dow Chemical.

In an aspect, a polyolefin suitable for use in the present disclosure is characterized by a melt flow rate ranging from about 1 g/10 min, to about 200 g/10 min.

The polyolefin (e.g., polypropylene) may be present in the composition in an amount ranging from about 2% to about 98% based on the total amount of the composition.

In an aspect, the composition may comprise other components to meet one or more user and/process goals. Additives may be introduced to the composition to modify the tack, the odor, and/or the color of the present compositions and of any end-use articles. Such additives include lubricants, tackifiers, slip additives, antimicrobial additives, dusting agents, blue agents, colorants, antioxidants and the like. For example, antioxidants and other stabilizing ingredients can also be added to protect the composition from degradation induced by heat, light and processing or during storage. Several types of antioxidants can be used, either primary antioxidants like hindered phenols or secondary antioxidants like phosphite derivatives or blends thereof. Examples of commercially available antioxidants are IRGANOX 565 from Ciba-Geigy (2,4-bis-(n-octylthio)-6-(4-hydroxy-3,5-di-tertiary-butyl anilino)-1,3,5-triazine), IRGANOX 1010 from Ciba-Geigy (tetrakis-ethylene-(3,5-di-tertiary-butyl-4-hydroxy-hydrocinnamate)methane) and POLYGARD HR from Uniroyal (tris-(2,4-di-tertiary-butylphenyl)phosphite). Other antioxidants developed to protect the gelling of the polybutadiene segments can also be used, like the SUMILIZER GS from Sumitomo (2[1-(2-hydroxy-3,5-di-ter-pentylphenyl)ethyl)]-4,6-di-tert-pentylphenylacrylate); SUMILIZER T-PD from Sumitomo (pentaerythrythyltetrakis(3-dodecylthiopropionate)); or mixtures thereof.

In an aspect, a block copolymer of the type disclosed herein may be present in the composition in an amount of from about 5 wt. % to about 95 wt. % based on the total weight of the composition.

In an aspect, the other components of the composition (i.e., polyolefin, additives) may be present in an amount of from about 5 wt. % to about 95 wt. % based on the total weight of the composition.

Hereinafter, a composition comprising a block copolymer and polyolefin, both of the type disclosed herein is termed an improved performance composition (IPC). The IPC may be produced by any suitable process, such as compression molding, injection molding, extrusion, calendaring, or hybrids of extrusion and molding. For example, a process can comprise mixing components of the IPC (e.g., styrenic block copolymer and polypropylene) under heat to form a blend and achieve a substantially homogeneous compound. Alternatively, the components may be mixed and melt blended by any suitable methodology such as with Branbury mixers, intensive mixers, two-roll mill, and extruders. Time, temperature, and shear rate may be regulated to ensure optimum dispersion. After mixing, shaping can be carried. For example, an extruder may be used to shape the composition into pellets or profiles including but not limited to tubings. Films (including multilayer film) can be made from the IPC by melt-processing using techniques such as coating, co-extrusion, extrusion casting, blown film methods, and powder coating and sintering.

An IPC may be characterized by a MFR of from about 1 g/10 min. to about 200 g/10 min. as determined in accordance with ASTM D1238 at 230° C. and 2.16 kg weight.

In an aspect, an IPC of the type disclosed herein has a tensile strength of from about 5 MPa to about 80 MPa as determined in accordance with ASTM D412 or ASTM D638.

In an aspect, the IPC has a clarity in the range of from about 80% to about 90%. Clarity refers to the percentage of incident light which, in passing through a specimen of a material, is deflected by less than 0.1° from the axis of the incident light as measured in accordance with ASTM D1003.

In an aspect, the IPC has a processing temperature for tube extrusion of from about 150° C. to about 250° C. Plastic extrusion of a tube is a steady-state process for converting a thermoplastic raw material (e.g., IPC) to a finished or near-finished annular product. The processing temperature refers to the melt temperature of the molten polymer.

Films formed from IPCs of this disclosure may be characterized by a 100% secant modulus in the machine direction (MD) of from about 0.1 MPa to about 40 MPa, alternatively from about 0.3 MPa to about 20 MPa, or alternatively from about 0.5 MPa to about 10 MPa as determined in accordance with ASTM D412.

In an aspect, films formed from the IPCs of this disclosure are characterized by an elongation at break ranging from about 50% to about 1500% as determined in accordance with ASTM D412.

In an aspect, films formed from the IPCs of this disclosure are characterized by a haze of from about 1 to about 10, and a percent transmission of from about 90% to about 99.5%. Haze is the cloudy appearance of a material caused by light scattered from within the material or from its surface. The haze of a material can be determined in accordance with ASTM D1003 while light transmission refers to the percentage of the light energy being transmitted through a body of the light energy falling on it and may be determined in accordance with ASTM D1003.

The IPCs disclosed herein may be prepared into a variety of end-use articles using any suitable methodology. For example, the IPC may be fabricated into end-use articles such as a film, tape, tube, injection molded article, strip, fiber, or filament. The IPCs fabricated into end-use articles may be present in a single layer or as one layer in a multi-layer article. An injection molded article may have a hardness ranging from Shore A 40 to Shore D 70.

In an aspect, an IPC of the type disclosed herein is a component in the preparation of a multilayer protective film. In such aspects, the multilayer protective film may be prepared using any suitable methodology, such as extrusion or a blown film process. A nonlimiting example of a multilayer protective film comprising an IPC of the present disclosure may have at least one polyolefin layer (e.g., low density polyethylene or high density polyethylene), an IPC layer and/or an IPC comprising additives such as tackifiers.

In another aspect, the IPC may be used to prepare an extruded film, filament, fibers, or a plurality of fibers with high elasticity suitable for personal care applications. A nonlimiting example of a formulation for such applications includes the IPC and a tackifier where the IPC has the polyolefin present in an amount of from about 0 wt. % to about 80 wt. %, the block copolymer is present in an amount of from about 10 wt. % to about 90 wt. % and the tackifier is present in an amount of from about 20 wt. % to about 30 wt. % where the weight percentages are based on the total weight of the composition. Examples of a commercially available polyolefin suitable for use in such a formulation are INFUSE™ 9107 available from Dow Chemical and Vistamaxx™ grades available from ExxonMobil. A film prepared from the formulation may be characterized by a tensile strength of greater than about 10 MPa, an elongation of greater than about 500%, a secant modulus at 100% elongation of from about 0.3 MPa to about 1.5 MPa, and a hysteresis set after 100% elongation of about 5%. A film may be further characterized by a 1% secant modulus in the machine direction (MD) of from about 300 MPa to about 1200 MPa as determined in accordance with ASTM D882.

In an aspect, the block copolymer of the present disclosure may be a component of an adhesive formulation. In some aspects, the adhesive formulation comprises a polyolefin of the type disclosed herein. In alternative aspects, adhesive formulation excludes a polyolefin of the type disclosed herein. Such adhesive formulations may include without limitation pressure sensitive adhesives, hot melt adhesives, and fugitive adhesives. It is contemplated that the adhesive formulations may comprise a liquid solvent carrier or in the alternative the adhesive formulation is in 100% solid form. A non-limiting example of an adhesive formulation comprises from about 0 wt. % to about 80 wt. % polyolefin (e.g., an amorphous polypropylene), about 10 wt. % to about 50 wt. % block copolymer, and a tackifier present in an amount of from about 20 wt. % to about 60 wt. % where the weight percentages are based on the total weight of the formulation. In an aspect, an adhesive formulation including the block copolymer of the present disclosure may have a much lower melt viscosity and improved adhesive properties than the formulation without the block copolymer as described herein.

EXAMPLES

The subject matter of the present disclosure having been generally described, the following examples are given as particular aspects of the disclosure and to demonstrate the practice and advantages thereof. It is understood that the examples are given by way of illustration and are not intended to limit the specification or the claims to follow in any manner.

Melt index was determined in accordance with ASTM D 1238.

Shear viscosity was tested on a Rosand RH2000. The left barrel was a two piece die and the right barrel was with a one piece orifice die. The shear rate was set with 7 points from 50 s$^{-1}$ to 10000 s$^{-1}$.

Kink resistance was determined using a tubing 150 mm in length which was fixed to Instron grips on both ends at a distance of 100 mm. The sample was then compressed 100 mm/min to the point of kinking. The distance between the two grips at the end of the test was the apparent diameter to characterize the tubing's kink resistance: the smaller the apparent diameter; the better the kink resistance.

The transparency of specimens prepared from compositions of this disclosure was determined in accordance with ASTM 1003.

The tensile strength of specimens prepared from compositions of this disclosure was determined in accordance with ASTM D412.

The Shore A and D hardness of specimens prepared from compositions of this disclosure was determined in accordance with ASTM D2240.

ODT was measured on a Malvern (Bohlin) Gemini rheometer fitted with 25 mm parallel plates in oscillation mode with controlled strain in a heated nitrogen atmosphere. The ODT data was generated by measuring the complex viscosity of a polymer or compound plaque (e.g., IPC) at 2 frequencies (0.005 and 0.2 Hz) over a temperature range, and ODT is determined to be the temperature at which the complex viscosities at the two frequencies are no longer frequency dependent. The test gap is typically set at 1 mm.

Elasticity or hysteresis was tested on an Instron according to ASTM D882 at 100% and/or 300% elongation for two cycles on straight samples (15 mm width by 150 mm length) with 76.2 mm gauge length and a crosshead speed of 254 mm/min. Film samples of ~6 mil (~150 μm) were cast from a film extrusion line with a chill roll (Model LCR 350HD from Labtech Engineering). Tensile set and recovered energy are calculated to quantify elasticity or hysteresis.

Example 1

Styrenic block copolymers suitable for use in the present disclosure were prepared and designated sample 1 and sample 2. Specifically sample 1 was prepared by anionic polymerization of styrene and then butadiene in the presence of a microstructure control agent followed by coupling and then hydrogenation. The molecular weight of the polystyrene produced was determined to be 5.6 kg/mol by GPC. A sample collected at the end of the butadiene polymerization had a styrene content of approximately 13 wt. % and a vinyl content of 71.1% on the basis of $^1$H NMR and an overall molecular weight of 215 kg/mol as determined by GPC. The styrene and butadiene were coupled to form the final product with a coupling efficiency of 92.3%. A sample of the styrenic block copolymer was then hydrogenated.

Sample 2 was prepared by anionic polymerization of styrene and then butadiene in the presence of a microstructure control agent followed by coupling and then hydrogenation. The molecular weight of the polystyrene produced was determined to be 5.8 kg/mol by GPC. A sample collected at the end of the butadiene polymerization had a styrene content of approximately 13 wt. % and a vinyl content of 76.8% on the basis of $^1$H NMR and an overall molecular weight of 211 kg/mol as determined by GPC. The styrene and butadiene were then coupled to form the final product with a coupling efficiency of 91.2%. A sample of the polymer was hydrogenated.

Portions of samples 1 and 2 were taken such that the molecular weight of the polystyrene block and polystyrene-polybutadiene blocks could be determined. The amount of butadiene in the 1,2 configuration, polystyrene content (PSC) and the coupling efficiency before hydrogenation were also determined. The results of the testing are displayed below in Table 1.

TABLE 1

| Sample # | A Block MW (kg/mol) | AB diblock MW (kg/mol) | Coupling Efficiency (%) | $(AB)_3X$ triblock MW (kg/mol) | $(AB)_3X$ % | $(AB)_4X$ % | 1,2-addition diene in B block (%) | PSC (%) |
|---|---|---|---|---|---|---|---|---|
| 1 | 5.6 | 74.1 | 92.3 | 215.3 | 57.2 | 32.5 | 77.6 | 12.1 |
| 2 | 5.8 | 72.6 | 91.5 | 211.0 | 53.5 | 29.5 | 78.2 | 12.9 |

Additional performance properties of samples 1 and 2, such as melt flow rate (MFR), ODT, Shore A hardness and tensile properties, were determined and are presented in Table 2 along with the performance properties of a commercially available styrenic block copolymer, designated sample 3. Tensile properties were measured on melt cast films in both machine and cross directions; samples 1 and 2 were extrusion cast at 220° C., and the commercial sample 3 was extrusion cast at 240° C.

TABLE 2

| | Sample No. | | |
|---|---|---|---|
| | 1 | 2 | 3 |
| MFR (g/10 min) | 12.8 | 12.7 | 3.4 |
| ODT (° C.) | 220 | 220 | 240 |
| Shore A hardness (10s) | 38 | 36 | 39 |
| Tensile Properties Machine Direction | | | |
| Tensile Strength at break (MPa) | 9.3 | 8.5 | 5.3 |
| Elongation at break (%) | 920 | 880 | 670 |
| 25% Modulus (MPa) | 0.4 | 0.4 | 0.4 |
| 50% Modulus (MPa) | 0.6 | 0.6 | 0.7 |
| 100% Modulus (MPa) | 0.9 | 0.8 | 0.8 |
| 200% Modulus (MPa) | 1.2 | 1.2 | 1.3 |
| 300% Modulus (MPa) | 1.6 | 1.7 | 1.8 |
| 500% Modulus (MPa) | 3.1 | 2.9 | 3.2 |
| Tensile Properties Cross Direction | | | |
| Tensile Strength (MPa) | 8.4 | 8.6 | 13.0 |
| Elongation at break (%) | 910 | 930 | 1070 |
| 25% Modulus (MPa) | 0.4 | 0.4 | 0.4 |
| 50% Modulus (MPa) | 0.6 | 0.6 | 0.5 |
| 100% Modulus (MPa) | 0.8 | 0.8 | 0.8 |
| 200% Modulus (MPa) | 1.1 | 1.1 | 1.1 |
| 300% Modulus (MPa) | 1.4 | 1.5 | 1.4 |
| 500% Modulus (MPa) | 2.6 | 2.6 | 2.5 |
| IR | 0.90 | 1.0 | 2.4 |

Example 2

Characteristics of IPCs of the type disclosed herein were investigated. Specifically, IPC samples were prepared containing a styrenic block copolymer and a polypropylene in a 70:30 weight ratio. Table 3 presents various properties of these compositions where the IPCs comprising the styrenic polymers from Example 1, samples 1 and 2 are designated compositions 4 and 5 respectively. Test specimens were cut from injection molded plaques; compound #2 and #3 were injection molded at 230° C., and compounds #4 and #5 were injection molded at 210° C. Composition 1 comprises PVC, composition 2 comprises sample 3 of Example 1, and composition 3 comprises a commercially available hydrogenated thermoplastic rubber.

TABLE 3

| | Sample | | | | |
|---|---|---|---|---|---|
| | 1 | 2 | 3 | 4 | 5 |
| HSBC | NA | Sample 3 | TPE | Sample 1 | Sample 2 |
| MFR g/10 min | NA | 6.4 | 4.4 | 15.2 | 15.5 |
| Shore A hardness | 72 | 74 | 76 | 75 | 75 |
| Kink resistance | | | | | |
| Tubing OD (mm) | 3.9 | 4.0 | 4.0 | 4.0 | 4.0 |
| Tubing wall thickness (mm) | 0.46 | 0.43 | 0.48 | 0.25 | 0.48 |
| Kink Force (N) | 0.3 | 0.2 | 0.3 | 0.3 | 0.3 |
| Kink Radius (mm) | 19.0 | 22.2 | 19.2 | 22.0 | 20.2 |
| Tensile Properties (Machine Direction) | | | | | |
| Tensile Strength (MPa) | 12.8 | 12.8 | 9.9 | 13.7 | 13.7 |
| Elongation Area (%) | 170 | 640 | 540 | 720 | 740 |
| 25% Modulus (MPa) | 2.8 | 2.2 | 2.2 | 2.4 | 2.4 |
| 50% Modulus (MPa) | 5.8 | 2.6 | 2.8 | 2.9 | 2.8 |
| 100% Modulus (MPa) | 9.5 | 3.2 | 3.3 | 3.3 | 3.4 |
| 200% Modulus (MPa) | NA | 4.1 | 4.1 | 3.7 | 3.8 |
| 300% Modulus (MPa) | NA | 5.3 | 5.5 | 4.8 | 4.8 |
| 500% Modulus (MPa) | NA | 9.0 | 9.0 | 7.7 | 7.7 |
| Tensile Properties (Cross Direction) | | | | | |
| Tensile Strength (MPa) | 17.7 | 17.9 | 15.3 | 13.4 | 14 |
| Elongation at break (%) | 400 | 920 | 890 | 830 | 840 |
| 25% Modulus (MPa) | 2.1 | 2.2 | 2.1 | 2.3 | 2.4 |
| 50% Modulus (MPa) | 4 | 2.7 | 2.6 | 2.8 | 2.8 |
| 100% Modulus (MPa) | 6.4 | 3.0 | 3.0 | 3.1 | 3.1 |
| 200% Modulus (MPa) | 9.9 | 3.8 | 3.6 | 3.7 | 3.8 |
| 300% Modulus (MPa) | 12.8 | 4.7 | 4.3 | 4.8 | 4.8 |
| 500% Modulus (MPa) | NA | 7.5 | 6.8 | 7.7 | 7.7 |
| IR | 1.4 | 1.4 | 1.5 | 0.98 | 1.0 |
| Transparency | | | | | |
| Clarity (%) | 87 | 96 | 95 | 96 | 95 |
| Transmission (%) | 91 | 92 | 91 | 90 | 90 |
| Haze (%) | 9.3 | 8.6 | 14.0 | 12.4 | 11.8 |

Example 3

The elasticity of samples 1 and 3 were investigated and the results are presented in Table 4.

TABLE 4

| Hysteresis | Sample 1 | | Sample 3 | |
|---|---|---|---|---|
| | Machine Direction | Cross Direction | Machine Direction | Cross Direction |
| Hysteresis with 100% elongation | | | | |
| First cycle tensile set (%) | 4.9 | 5.3 | 3.7 | 4.7 |
| First cycle energy recovered (%) | 89 | 90 | 92 | 92 |
| Second cycle tensile set (%) | 5.6 | 5.8 | 4.1 | 4.5 |
| Second cycle energy recovered (%) | 93 | 93 | 95 | 95 |
| Hysteresis with 300% elongation | | | | |
| First cycle tensile set (%) | 10.0 | 10.9 | 7.5 | 7.5 |
| First cycle energy recovered (%) | 89 | 89 | 92 | 92 |
| Second cycle tensile set (%) | 11.0 | 12.1 | 8.1 | 8.2 |
| Second cycle energy recovered (%) | 94 | 94 | 96 | 96 |

Example 4

The benefit of IPCs in adhesive formulations were investigated. Specifically, the properties of a hot-melt adhesive formulation including IPC were measured. Table 5 shows an exemplary formulation and the results of the test.

TABLE 5

| | Samples | | |
|---|---|---|---|
| | #A1 | #A2 | #A3 |
| Formulation | | | |
| Block Copolymer | 40 | | |
| Commercial Grade 1 | | 40 | |
| Commercial Grade 2 | | | 40 |
| Hydrogenated tackifier | 45 | 45 | 45 |
| Mineral oil | 14.9 | 14.9 | 14.9 |
| Properties | | | |
| Rolling Ball Tack (cm) | 8.4 | 11.2 | 13.8 |
| Loop Tack (lbf) | 1.35 | 1.46 | 0.72 |
| Holding power to steel (min) | 6523 | >10,000 | 2763 |
| 180 deg peel force (lbf/in) | 0.51 | 0.55 | 0.36 |
| SAFT (° C.) | 58 | 66 | 60 |
| Hot melt viscosity at 177° C. (cps) | 6,670 | 8,050 | 23,727 |

Figure 1:
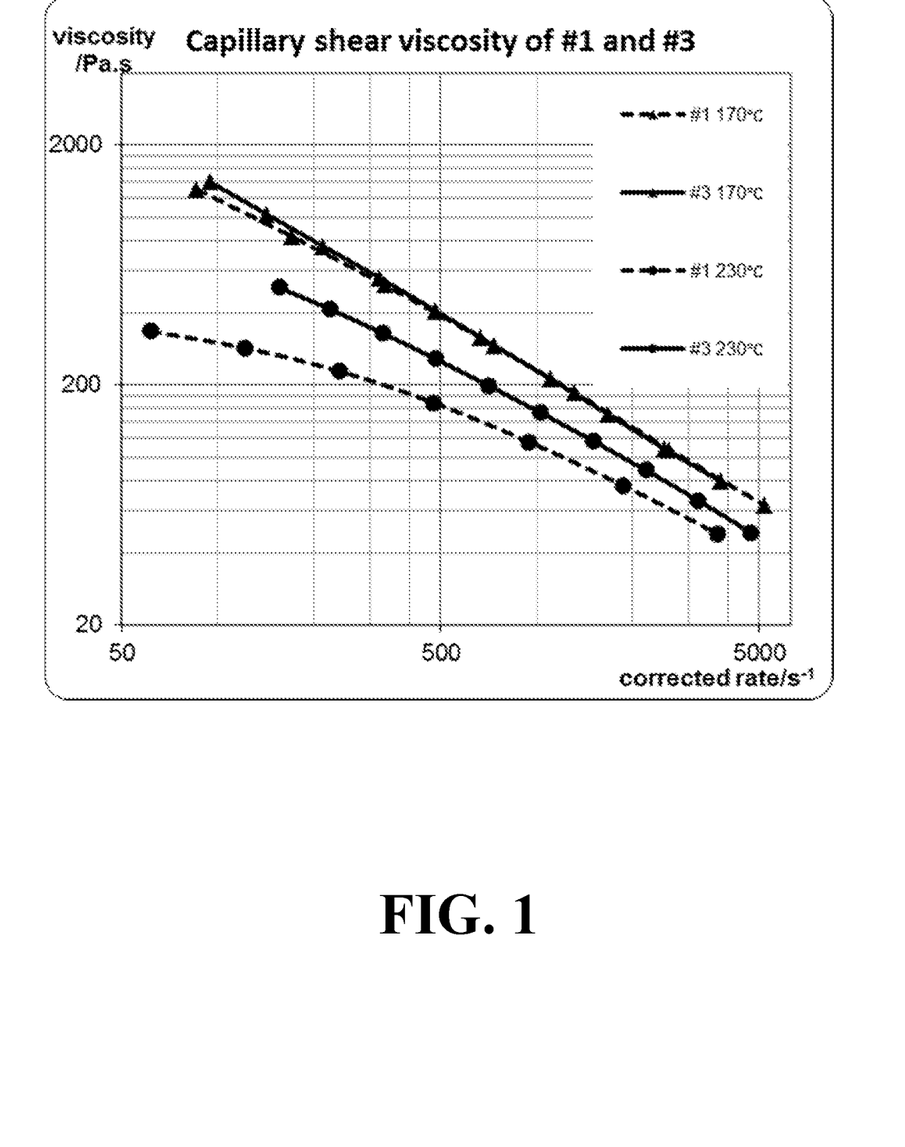
FIG. 1 is a plot of the capillary shear viscosity for samples of Example 1 at 170° C. and 230° C.
Figure 2:
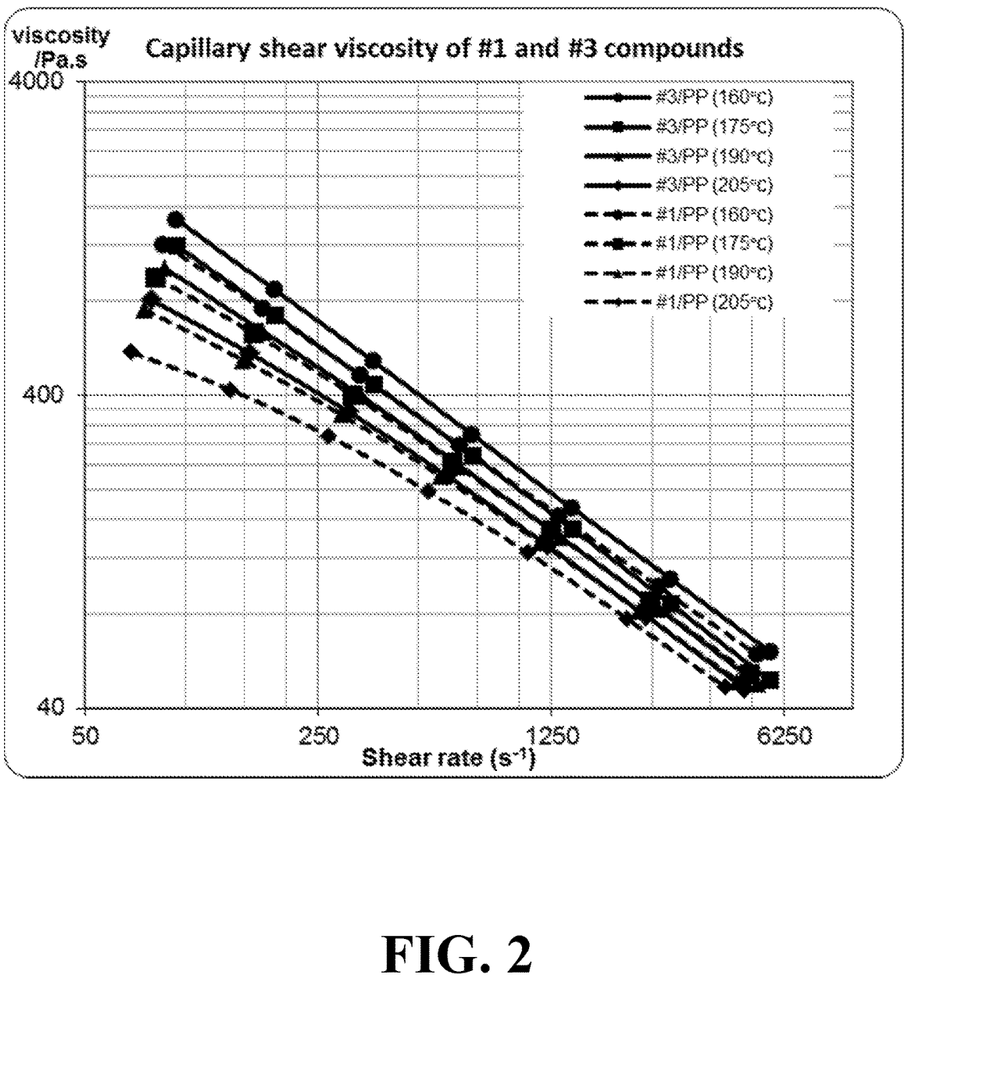
FIG. 2 is a plot of the capillary shear viscosity for the samples of Example 2 at 160° C., 175° C., 190° C., and 205° C.

Additional performance properties of IPCs of the type disclosed herein were investigated and the results presented in FIGS. 1 and 2.

The terms "a," "an," and "the" are intended, unless specifically indicated otherwise, to include plural alternatives, e.g., at least one. Herein, while compositions and processes are described in terms of "comprising" various components or steps, the compositions and methods can also "consist essentially of" consist of the various components or steps. A particular feature of the disclosed subject matter can be disclosed as follows: Feature X can be A, B, or C. It is also contemplated that for each feature the statement can also be phrased as a listing of alternatives such that the statement "Feature X is A, alternatively B, or alternatively C" is also an embodiment of the present disclosure whether or not the statement is explicitly recited.

While various aspects of the present disclosures have been shown and described, modifications thereof can be made by one skilled in the art without departing from the spirit and teachings of the invention. The aspects of the present disclosures described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an aspect of the present disclosure of the present invention. Thus, the claims are a further description and are an addition to the aspect of the present disclosures of the present disclosure. The discussion of a reference in the present disclosure is not an admission that it is prior art to the present disclosure, especially any reference that may have a publication date after the priority date of this application. The present disclosures of all patents, patent applications, and publications cited herein are hereby incorporated by reference, to the extent that they provide exemplary, procedural or other details supplementary to those set forth herein.

The invention claimed is:

1. A composition comprising i) a selectively hydrogenated styrenic block copolymer present in an amount of from about 5 wt. % to about 95 wt. % based on the total weight of the composition and ii) a polyolefin present in an amount of from about 2 wt. % to about 98 wt. % based on the total weight of the composition, wherein the composition has an Isotropic Ratio of less than about 1.4 as measured on extruded film with process temperature of less than about 250° C.;
wherein prior to hydrogenation, the styrenic block copolymer has a configuration $(AB)_nX$ or $(A_1BA_2)_nX$;
wherein A, $A_1$, and $A_2$ are polymer blocks of at least one monoalkenyl arene having a molecular weight from 5-6 kg/mol;
B is a polymer block of at least one conjugated diene, having a molecular weight from 65 kg/mol to 92 kg/mol; and a vinyl content from 60 mol percent to 85 mol percent;
n is 2-6; and X is a residue of a coupling agent;
and wherein the styrenic block copolymer has a styrene content of 10-15 weight percent.

2. The composition of claim 1, wherein the monoalkenyl arene is selected from the group consisting of styrene, alpha-methylstyrene, para-methylstyrene, vinyl toluene, vinylnaphthalene, diphenyl ethylene, para-butyl styrene, and mixtures thereof.

3. The composition of claim 1, wherein the coupling agent is an alkoxysilane.

4. The composition of claim 1 wherein the A block is a polystyrene block.

5. The composition of claim 1, wherein the B block comprises a polybutadiene.

6. The composition of claim 1, wherein when n is equal to 3, the styrenic block copolymer, prior to hydrogenation, has a molecular weight from 170 kg/mol to 230 kg/mol.

7. The composition of claim 1, wherein the selectively hydrogenated styrenic block copolymer has a 100% modulus at elongation ranging from about 0.4 MPa to about 1.6 MPa as determined in accordance with ASTM D412.

8. The composition of claim 1, wherein the polyolefin has a melt index of from about 1 g/10 min. to about 200 g/10 min, measured in accordance with ASTM D 1238.

9. The composition of claim 1, wherein an extruded film of the selectively hydrogenated styrenic block copolymer has an elongation at break ranging from about 500% to about 1600% as determined in accordance with ASTM D412.

10. The composition of claim 1, wherein the selectively hydrogenated styrenic block copolymer has an order-disorder transition temperature (ODT) of from about 180° C. to about 260° C.

11. The composition of claim 1, wherein the polyolefin comprises polypropylene.

12. The composition of claim 1, further comprising one or more of lubricants, slip additives, tackifiers, dusting agents, blue agents, colorants, and antioxidants.

13. The composition of claim 1, having a melt index of from about 1 g/10 min. to about 200 g/10 min. as determined in accordance with ASTM D1238 at 230° C. and 2.16 kg weight.

14. The composition of claim 1, wherein an extruded film of the composition has a tensile strength of from about 5 MPa to about 80 MPa as determined in accordance with ASTM D412 or ASTM D638.

15. The composition of claim 1, having a clarity in the range of from about 80% to about 90%, measured in accordance with ASTM D1003.

16. A film formed from the composition of claim 1.

17. A tube prepared from the composition of claim 1.

18. An injection molded article prepared from the composition of claim 1.

* * * * *